(12) United States Patent
Berens et al.

(10) Patent No.: US 9,214,928 B2
(45) Date of Patent: Dec. 15, 2015

(54) CLOCK DOUBLING CIRCUIT AND METHOD OF OPERATION

(71) Applicants: Michael T. Berens, Austin, TX (US); Dale J. McQuirk, Austin, TX (US)

(72) Inventors: Michael T. Berens, Austin, TX (US); Dale J. McQuirk, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 71 days.

(21) Appl. No.: 14/170,070

(22) Filed: Jan. 31, 2014

(65) Prior Publication Data

US 2015/0222253 A1  Aug. 6, 2015

(51) Int. Cl.
*H03B 19/00* (2006.01)
*H03K 5/00* (2006.01)

(52) U.S. Cl.
CPC ................... *H03K 5/00006* (2013.01)

(58) Field of Classification Search
CPC .................................................. H03K 5/00006
USPC ......................................... 327/116, 119, 122
See application file for complete search history.

(56) References Cited

U.S. PATENT DOCUMENTS

| | | |
|---|---|---|
| 4,799,022 A | 1/1989 | Skierszkan |
| 5,434,522 A | 7/1995 | Fikart et al. |
| 6,259,283 B1 | 7/2001 | Nguyen |
| 6,426,660 B1 | 7/2002 | Ho et al. |
| 6,664,824 B2 | 12/2003 | Laws |
| 6,882,191 B2 | 4/2005 | Kwok |
| 6,967,508 B2 | 11/2005 | Zhou et al. |
| 7,061,285 B2 | 6/2006 | Woods |
| 7,173,464 B2 | 2/2007 | Nagasue |
| 7,579,884 B2 | 8/2009 | Masson |
| 7,683,683 B1 | 3/2010 | Majumder et al. |
| 2003/0025537 A1* | 2/2003 | Laws ............................. 327/122 |
| 2004/0257129 A1* | 12/2004 | Kwok ........................... 327/116 |

* cited by examiner

*Primary Examiner* — William Hernandez

(57) ABSTRACT

A clock doubler circuit includes a filtering circuit. The filtering circuit includes a first input to receive a first clock signal, a first output to provide a second clock signal, and a second output to provide a third clock signal. The third clock signal is a complementary signal to the second clock signal. The first clock signal, the second clock signal, and the third clock signal are at a first clock frequency. The second clock signal is a low pass filtered version of the first clock signal. The clock doubler circuit includes a frequency doubling circuit. The frequency doubling circuit includes a first input to receive the second clock signal and a second input to receive the third clock signal. The frequency doubling circuit includes an output node. The output node provides a fourth clock signal at a second clock frequency that is twice the first clock frequency.

19 Claims, 3 Drawing Sheets

CLOCK DOUBLING CIRCUIT AND METHOD OF OPERATION

BACKGROUND

1. Field

This disclosure relates generally to clock generators, and more particularly to clock generators that generate a clock that has a frequency double that of an input clock.

2. Related Art

Many integrated circuits have operations that require a clock and utilize a master clock to generate the various clocks as needed. One clock that is often beneficial is one that is double that of the master clock. One example is an analog to digital converter where a desired sample rate is greater than that of the master clock or twice as many phases are required from the master clock to perform the conversion and doubling is commonly what is desired. A frequency doubler typically is preferred to have a 50 percent duty cycle, and it is also preferred that the doubler have a comparatively fast start-up time. Although phase locked loops are effective at achieving the desired 50 percent duty cycle, the fast start-up time is difficult to achieve. Other methods such as variable delays with XOR gates to double the clock frequency take time to stabilize to the desired 50% duty cycle.

Accordingly there is a need to provide further improvement in achieving a frequency doubler.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a frequency doubler converts a square wave clock to a filtered true and complementary clocks that have substantially slower transition times. The complementary clocks are used to generate a doubled clock that has slower transition times than the square wave clock. The doubled clock is then used to generate the doubled clock with transition times comparable to those of the square wave clock. This is better understood by reference to the drawings and the following written description.

Figure 1:
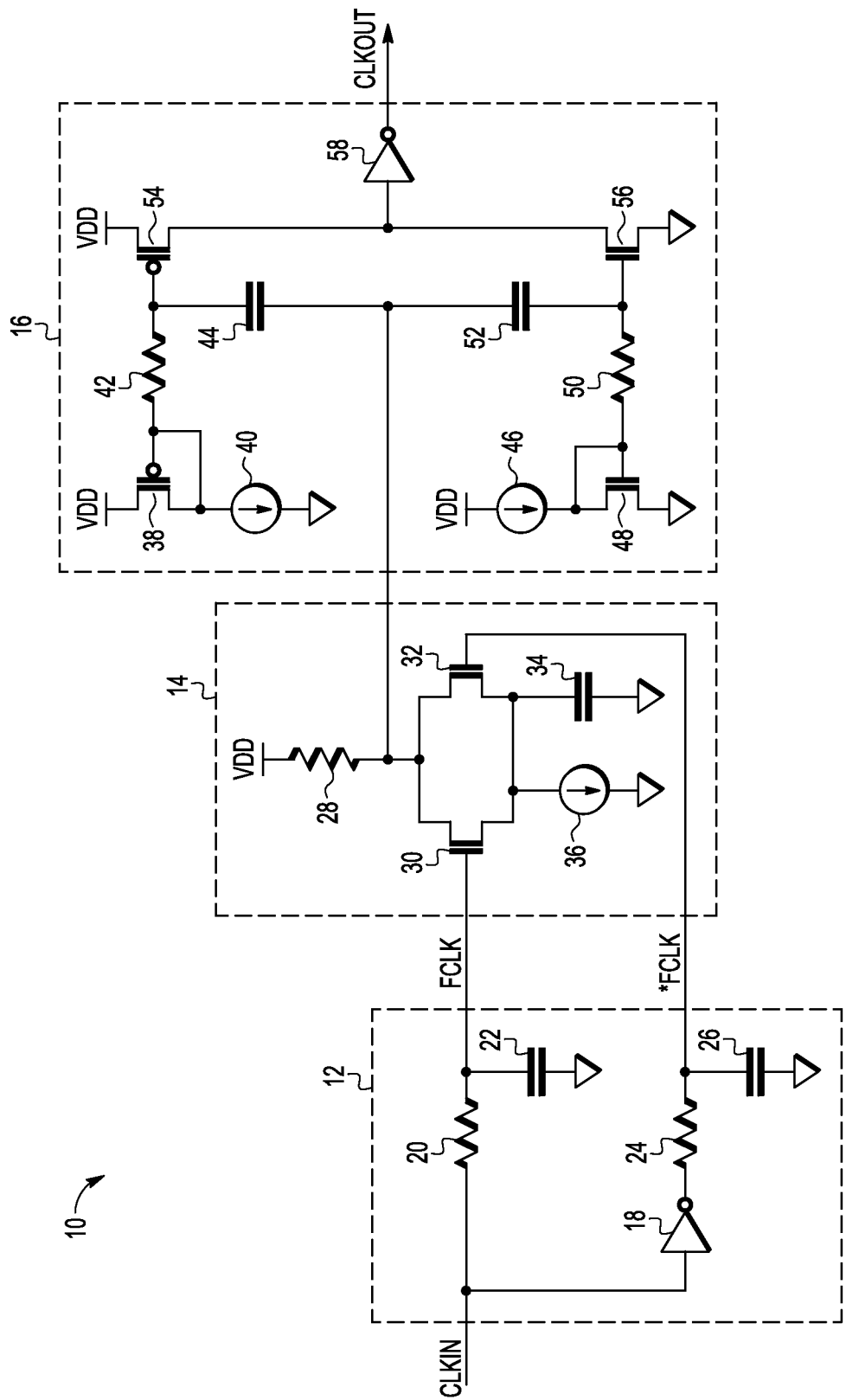
FIG. 1 is a circuit diagram of a frequency doubler.

Shown in FIG. 1 is a clock doubler circuit 10 having a low pass filter 12, a frequency doubling circuit 14, and a clock shaping circuit 16. Low pass filter 12 has an inverter 18, a resistor 20, a capacitor 22, a resistor 24, and a capacitor 26. Inverter 18 has an input that receives an input clock Clkin and an output. Resistor 24 has an input connected to the output of inverter 18 and a second terminal. Capacitor 26 has a first terminal connected to the second terminal of resistor 24 and a second terminal connected to a negative power supply terminal, which may be ground. Resistor 20 has a first terminal that receives input clock Clkin and a second terminal. Capacitor 22 has a first terminal connected to the second terminal of resistor 20 and a second terminal connected to the negative power supply terminal. Low pass filter 12 provides a filtered clock signal Fclk at the first terminal of capacitor 22 and the second terminal of resistor 20 and a complementary filtered clock signal *Fclk at the first terminal of capacitor 26 and the second terminal of resistor 24.

Frequency doubling circuit 14 has a resistor 28, an N channel transistor 30, an N channel transistor 32, a capacitor 34, and a current source. Resistor 28 has a first terminal connected to a positive power supply terminal shown as VDD and a second terminal. Transistor 30 has a drain connected to the second terminal of resistor 28, a gate connected to the second terminal of resistor 20 and the first terminal of capacitor 22 and thereby receives filtered clock Fclk, and a source. Drains and sources are typically made so that the designation of drain or source is based on usage so that drains and sources may be referenced as current terminals. The gate may be referenced as a control terminal. Transistor 32 has drain connected to the second terminal of resistor 28 and the drain of transistor 30, a gate connected to the second terminal of resistor 24 and the first terminal of capacitor 26 and thereby receives complementary filtered clock *Fclk, and a source. Capacitor 34 has a first terminal connected to the sources of transistors 30 and 32 and a second terminal connected to the negative power supply terminal. Current source 36 has an input connected to the sources of transistors 30 and 32 and the first terminal of capacitor 34 and an output connected to the negative power supply terminal. A doubled output O1 is provided at the drains of transistors 30 and 32 and the second terminal of resistor 28. Resistor 28 may be considered a load element.

Clock shaping circuit 16 has a P channel transistor 38, a current source 40, a resistor 42, a capacitor 44, a P channel transistor 54, a current source 46, an N channel transistor 48, a resistor 50, a capacitor 52, an N channel transistor 56, and an inverter 58. Transistor 38 has a source connected to VDD and gate and drain connected together. Current source 40 has an input connected to the gate and source of transistor 38 and an output connected to the negative power supply terminal. Resistor 42 has a first terminal connected to the gate and source of transistor 38 and the input of current source 40 and a second terminal. Capacitor 44 has a first terminal connected to the second terminal of resistor 42 and a second terminal connected to the second terminal of resistor 28 and the drains of transistors 30 and 32. Transistor 54 has a gate connected to the first terminal of capacitor 44 and the second terminal of resistor 42, a source connected to VDD, and a drain. Current source 46 has an input connected to VDD and an output. Transistor 48 has a gate and drain connected to the output of current source 46 and a source connected to the negative power supply terminal. Resistor 50 has a first terminal connected to the gate and drain of transistor 48 and the output of current source 46 and a second terminal. Capacitor 52 has a first terminal connected to the second terminal of resistor 50 and a second terminal connected to the second terminal of capacitor 44, the drains of transistor 30 and 32, and the second terminal of resistor 28. The second terminals of capacitors 44 and 52 thereby receive doubled output O1. Transistor 56 has a gate connected to the second terminal of resistor 50 and the first terminal of capacitor 52, a source connected to the negative power supply terminal, and a drain. Inverter 58 has an input connected to the drains of transistors 54 and 56 and an output that provides an output clock Clkout that is double the frequency of input clock Clkin.

Figure 2:
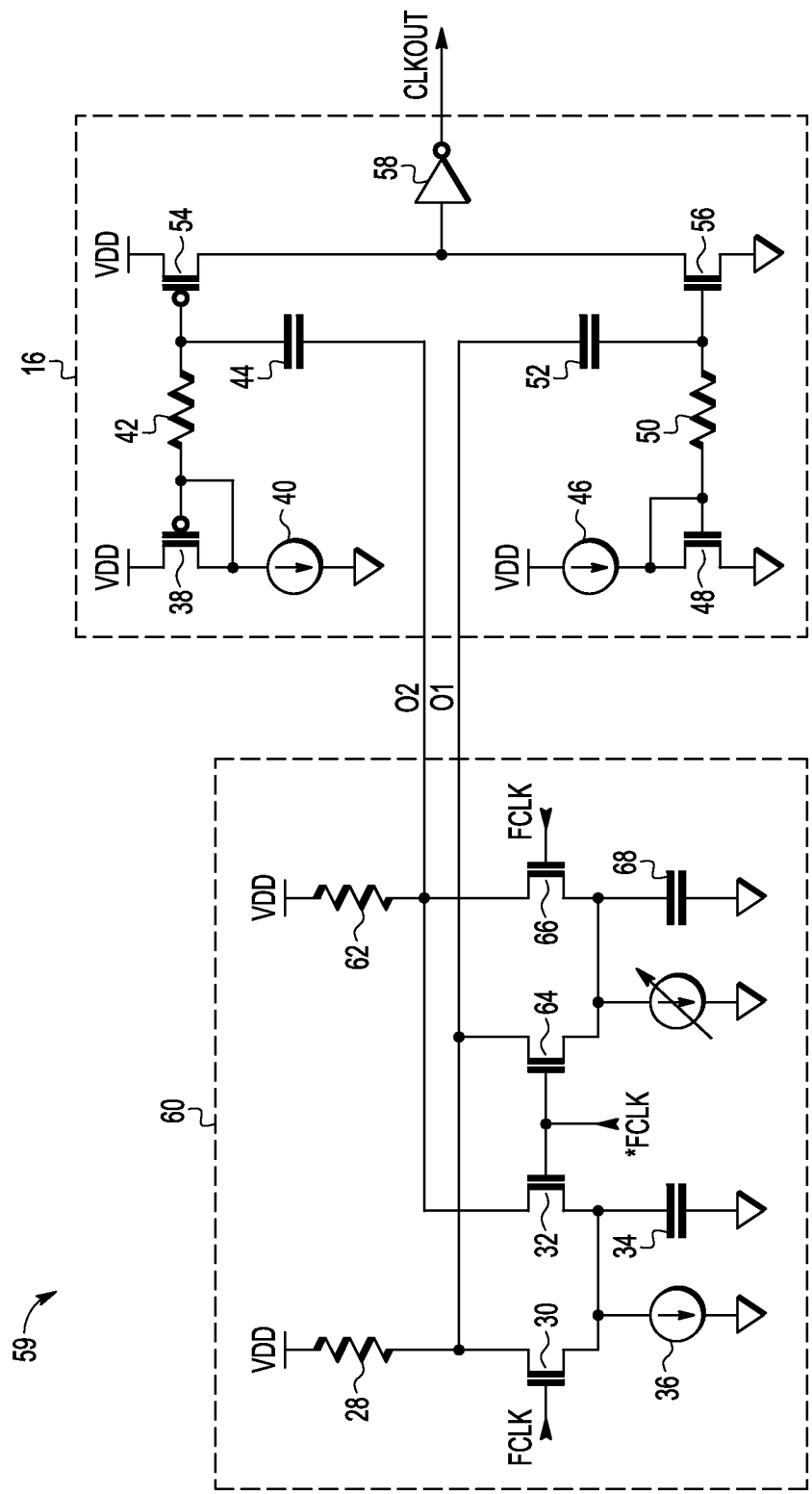
FIG. 2 is a circuit diagram of a variation of the frequency doubler of FIG. 1.

Shown in FIG. 2 is a clock doubler circuit 59 that is similar to clock doubler circuit 10 of FIG. 1. Clock doubler circuit 59 has a frequency doubling circuit 60 that replaces frequency doubling circuit 14 of FIG. 1. The changes to doubling circuit 14 are as follows: the drain of transistor 64 of frequency doubling circuit 14 is not connected to the drain of transistor 30, the second terminal of resistor 28, or the second terminal of capacitor 52; and the drain of transistor 30 is not connected to second terminal of capacitor 44. The change to clock shaping circuit 16 from FIG. 1 to FIG. 2 is that the second terminals of capacitors 44 and 52 are not connected together. Frequency doubling circuit 60 has, in addition to the components of frequency doubling circuit 14, a resistor 62, N channel transistors 64 and 66, a capacitor 68, and a variable current source 70. Resistor 62 has a first terminal connected to VDD and a second terminal connected to the drain of transistor 32. Transistor 64 has a drain connected to the second terminal of resistor 28, the drain of transistor 30 and the second terminal of capacitor 52. Transistor 64 further has a gate connected to the gate of transistor 32 and receives complementary filtered clock *Fclk and a source. Transistor 66 has a drain connected to the second terminal of resistor 62, the drain of transistor 32, and the second terminal of capacitor 44. Transistor 66 further has a gate for receiving filtered clock Fclk and connected to the gate of transistor 30 and a source. Capacitor 68 has a first terminal connected to the sources of transistors 64 and 66 and a second terminal connected to the negative power supply terminal. Variable current source 70 has an input connected to the sources of transistors 64 and 66 and the first terminal of capacitor 68 and an output connected to the negative power supply terminal.

Figure 3:
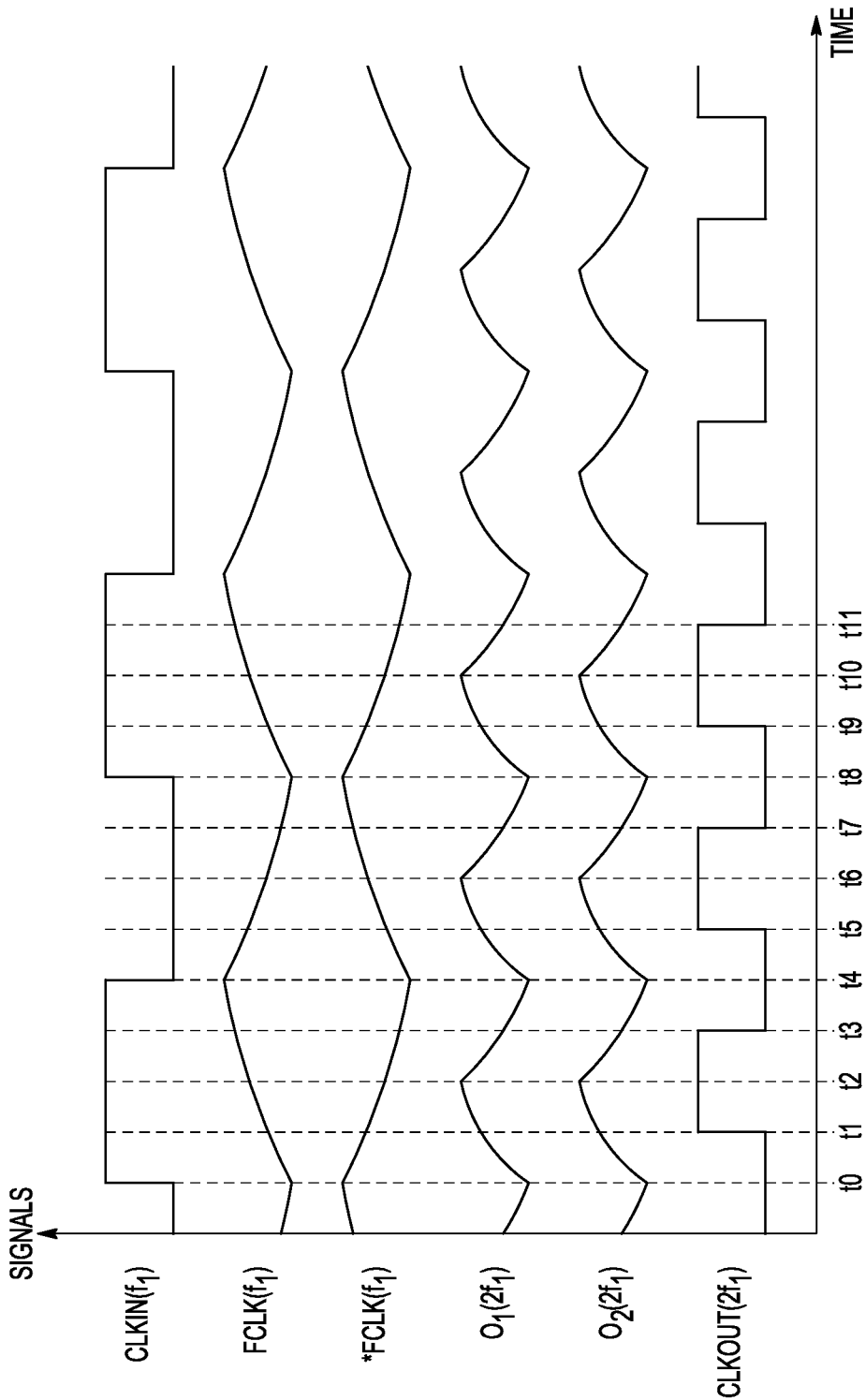
FIG. 3 is a timing diagram helpful in understanding the operation of the frequency doublers of FIGS. 1 and 2.

Regarding the operation of clock doubler circuit 10 of FIG. 1 with reference to a timing diagram shown in FIG. 3, at a time t0, Clkin is at a logic low so that inverter 18 is providing a logic high output. At this time t0, inverter 18 is just starting to transition to a logic low. Thus at this time t0, the voltage of complementary filtered clock signal *Fclkin at the second terminal of capacitor 26 will be at a maximum voltage. Also at this time t0, filter clock signal Fclk at the second terminal of capacitor 34 will be at a minimum voltage. In such case transistor 30 will be non-conductive or nearly so. Transistor 32 will be at maximum conductivity and output O1 will be at a minimum. Capacitor 34 will have been absorbing the current to allow for the decrease in voltage of output O1. In this situation the effective resistance of the combination of transistors 30 and 32 is at a minimum even with transistor 30 being non-conductive because transistor 32 is very highly conductive. Clkout is a logic low with the input to inverter 58 at a logic high. The gate of transistor 54 is at a sufficiently low voltage so that transistor 54 is a highly conductive to couple VDD to the input of inverter 58. Transistor 56 is sufficiently non-conductive to avoid excessive current between VDD and the negative power supply terminal. With output O1 at its lowest voltage, the capacitive coupling through capacitors 44 and 52 place the gates of transistors 54 and 56 in their desired states of conductive and non-conductive, respectively. The DC bias for the gate voltage of transistor 54 is controlled by transistor 38, current source 40, and resistor 42. Similarly, the DC bias for the gate voltage of transistor 56 is controlled by transistor 48, current source 46, and resistor 50.

Upon the transition of input clock Clkin to a logic high at time t0, complementary filtered clock signal *Fclk begins dropping in voltage at a rate controlled by resistor 24 and capacitor 26 so that the input to transistor 32 drops at this controlled rate. Similarly filtered clock signal Fclk begins rising at a rate controlled by resistor 20 and capacitor 22. Transistor 30 will become more conductive and transistor 32 will be declining in conductivity but the decline in conductivity of transistor 32 is occurring at a faster rate than the increase in conductivity of transistor 30 thus the overall resistance of the parallel pair of transistors 30 and 32 is increasing. With the increase in resistance of the parallel pair of transistors 30 and 32, output O1 continues to rise until, at time t1, the gate voltage of transistor 54 and the gate voltage of transistor 56 reverse conditions to the point where inverter 58 detects an input of a logic low which causes inverter 58 to provide output clock Clkout at a logic high. As filtered clock Fclk continues to rise and complementary filtered clock *Fclk continues to drop, the gates of transistors 30 and 32 come closer to the same voltage. There comes a point at which they become equal so that the combination of the conductances of transistors 30 and 32 becomes a minimum and output O1 reaches a maximum at a time t2. At this point, even though filtered Fclk continues to rise and complementary filtered clock *Fclk continues to drop, the combined conductances of transistors 30 and 32 begins to increase thereby reducing the voltage of output O1. The voltages on the gates of transistors 30 and 32 continue become more different with the result of continued increase in the combined conductivity of transistors 30 and 32. The corresponding drop in voltage of output O1 eventually reaches a point at which the switch point of clock shaping circuit 16 is reached resulting in clock out Clkout switching back to a logic high at time t3. The result is that clock out Clkout is a logic high between time t1 and time t3. Time t2 need be at the midpoint between time t1 and time t3.

After time t3, the gate voltages of transistors 30 and 32 continue to separate further until time t4 at which time input clock Clkin switches to a logic low causing the gate voltages of transistors 30 and 32 to begin converging and decreasing the conductance of the combination of transistors 30 and 32. This results in output O1 increasing which will continue until the gates of transistors 30 and 32 are at the same voltage at time t6. Prior to time t6, at time t5, the switch point of clock shaping circuit 16 is reached so that inverter 58 switches from providing a logic low to providing a logic high. The switch point of clock shaping circuit 16 is chosen so that the time between time t1 and time t3 is equal to the time between time t3 and time t5 to obtain the desired 50 percent duty cycle.

The process continues after time t6 with the complementary filtered clock signal *Fclk exceeding the filtered clock signal Fclk so that output O1 begins declining until at time t7 the switch point of clocking shaping circuit 16 being reached which causes clock out Clkout to switch to a logic low. Output O1 continues to decline until time t8 at which the input clock Clkin switches to a logic low. This causes filtered clock signal Fclk to reverse its direction so that at time t9, the switch point of clock shaping circuit 16 is reached causing clock out to switch to a logic high. Output O1 begins declining at time t10 and then reaching the switch point of clock shaping circuit O1 at time t11 at which time clock shaping circuit switches output clock Clkout to a logic low.

The use of the fact that the impedance of the transistor pair 30 and 32, which may be called a differential pair, reaches a maximum when the inputs are equal with result that the impedance then goes down regardless of which input increases and which input decreases effectively results in doubling the frequency very simply. The conversion from a very fast transition time signal, input clock Clkin, to a pair of relatively slow transition time signals provides for effective selectivity of the switch point for a doubled clock with fast transition times and in which the desired 50 percent duty cycle is obtained. Input clock Clkin is typically expected to be a square wave but it is to be understood that such clocks are not perfectly square. The square wave is ideal, and from Fourier analysis, has frequencies that are far greater than the base frequency simply calculated as the inverse of the period. From the same Fourier analysis, the content of higher frequencies than the base frequency of the filtered clock signal Fclk is less than the higher frequencies for the input clock Clkin. This may also be described as input clock Clkin having higher frequency components than filtered clock signal Fclk.

In the described example, this is achieved by low pass filtering input Clkin and its complement.

Shown in FIG. 2 is tunable clock doubler circuit 59 so that the switch point can be adjusted to ensure that the 50 percent duty cycle can be achieved with a high degree of precision. Four transistors are utilized to achieve differential pairs in two different ways. In one way transistors 30 and 32 are a differential pair sharing current source 36 and transistors 64 and 66 are a differential pair sharing variable current source 70. In another way transistors 30 and 64 are a differential pair sharing resistor 28 and transistors 32 and 66 are a differential pair sharing resistor 62. Resistor 28 is used to produce output O2 for the switch point detection for N channel transistor 56, and resistor 62 is used to produce output O1 for the switch point detection for P channel transistor 54. If all of the components match perfectly, outputs O1 and O2 should be identical as shown in FIG. 3. If that is not the case, current source 70 can be varied until the switch point or switch points of clock shaping circuit 16 are optimized. This desired condition of current source 70 can be determined at test and permanently implemented by flash or fuse technology. Another possibility is to have an internal test that is performed at some other time such as at each startup.

By now it should be appreciated that there has been provided a clock doubler circuit. The clock doubler circuit includes a filtering circuit including a first input to receive a first clock signal, a first output to provide a second clock signal, and a second output to provide a third clock signal, wherein the third clock signal is a complementary signal to the second clock signal, wherein the first clock signal, the second clock signal, and the third clock signal are at a first clock frequency, wherein the second clock signal is a low pass filtered version of the first clock signal. The clock doubler circuit further includes a frequency doubling circuit. The frequency doubling circuit includes a first input to receive the second clock signal and a second input to receive the third clock signal. The frequency doubling circuit further includes an output node, the output node providing a fourth clock signal at a second clock frequency that is twice the first clock frequency. The doubler circuit may have a further characterization by which the frequency doubling circuit includes a current source, a first transistor coupled in series between the output node and the current source, a control terminal of the first transistor coupled to receive the second clock signal, a second transistor coupled to the current source, a control terminal of the second transistor coupled to receive the third clock signal, and a load element located between a voltage supply terminal and the output node. The doubler circuit may have a further characterization by which the second transistor includes a second current terminal, the output node is coupled between the load element and the second current terminal of the second transistor. The doubler circuit may have a further characterization by which the frequency doubling circuit further comprises a capacitor coupled in parallel with the current source. The doubler circuit may have a further characterization by which the frequency doubling circuit further includes a second output node for providing a fifth clock signal at the second clock frequency, a third transistor coupled in series between the second output node and the second current source, a control terminal of the third transistor is coupled to receive the second clock signal, a fourth transistor coupled in series between the output node and the second current source, a control terminal of the fourth transistor is coupled to receive the third clock signal, and a second load element located between the voltage supply terminal and the second output node, wherein the second transistor is coupled in series between the second output node and the current source. The doubler circuit may further include a clock shaping circuit including a first input to receive the fourth clock signal and a second input to receive the fifth clock signal, the clock shaping circuit including an output to provide a sixth clock signal generated from the fourth clock signal and the fifth clock signal at the second clock frequency, wherein the sixth clock signal is characterized as having higher frequency components than the fourth clock signal and the fifth clock signal. The doubler circuit may have a further characterization by which the first current source is adjustable with respect to the second current source to adjust the duty cycle of the fourth clock signal. The doubler may further include a clock shaping circuit including a first input to receive the fourth clock signal, the clock shaping circuit including an output to provide a fifth clock signal generated from the fourth clock signal at the second clock frequency, wherein the fifth clock signal is characterized as having higher frequency components than the fourth clock signal. The doubler circuit may have a further characterization by which the first clock signal and the fifth clock signal are each characterized as square wave clock signals.

Also described is a method of doubling a frequency of a clock signal. The method includes receiving a first clock signal at a first clock frequency. The method further includes generating a second clock signal and a third clock signal at the first clock frequency from the first clock signal, wherein the third clock signal is a complementary signal to the second clock signal, wherein the second clock signal is a low pass filtered version of the first clock signal. The method further includes generating from the second clock signal and the third clock signal a fourth clock signal at a second clock frequency that is double the first clock frequency. The method may further include generating from the fourth clock signal, a fifth clock signal at the second clock frequency, wherein the fifth clock signal is characterized as having higher frequency components than the fourth clock signal. The method may have a further characterization by which the generating the fifth clock signal includes amplifying the fourth clock signal. The method may have a further characterization by which the first clock signal and the fifth clock signal are characterized as square wave clock signals. The method may have a further characterization by which the first clock signal is characterized as square wave clock signal. The method may have a further characterization by which the generating the second clock signal includes low pass filtering the first clock signal, wherein the generating the third clock signal includes inverting the first clock signal to produce an inverted clock signal and low pass filtering the inverted clock signal. The method may have a further characterization by which the generating the fourth clock signal includes controlling a first transistor with the second clock signal and controlling a second transistor with the third clock signal, wherein each of the first transistor and the second transistor includes a first current terminal connected to a node coupled to a current source, wherein the fourth clock signal is generated from an output node coupled between a second current terminal of the first transistor and a load element. The method may have a further characterization by which the output node is coupled between a second current terminal of the second transistor and the load element.

Described also is a clock doubler circuit including a current source. The clock doubler further includes a first input to receive a first clock signal at a first clock frequency. The clock doubler further includes a second input to receive a second clock signal, the second clock signal being a complementary clock signal to the first clock signal, wherein a square wave clock signal at the first clock frequency would be characterized as having higher frequency components than the first clock signal and the second clock signal. The clock doubler further includes an output node to provide a third clock signal at a second clock frequency that is double the first clock frequency. The clock doubler further includes a first transistor coupled in series between the output node and the current source, a control terminal of the first transistor coupled to receive the first clock signal. The clock doubler further includes a second transistor coupled to the current source, a control terminal of the second transistor coupled to receive the second clock signal. The clock doubler further includes a load element located between a voltage supply terminal and the output node. The clock doubler may have a further characterization by which the current source is coupled between a second voltage supply terminal and the first transistor, wherein the third clock signal has a peak to peak voltage that is less than a differential voltage between the voltage supply terminal and the second voltage supply terminal. The clock doubler may further include a filtering circuit including a first input to receive a fourth clock signal, a first output to provide the first clock signal, and a second output to provide the second clock signal, wherein the fourth clock signal and first clock signal are at the first clock frequency, wherein the first clock signal is a low pass filtered version of the fourth clock signal and a clock shaping circuit including a first input to receive the third clock signal, the clock shaping circuit including an output to provide a fifth clock signal generated from the third clock signal at the second clock frequency, wherein the fifth clock signal is characterized as having higher frequency components than the third clock signal.

Although the invention is described herein with reference to specific embodiments, various modifications and changes can be made without departing from the scope of the present invention as set forth in the claims below. For example, another technique for generating relatively slow transition signals from the input clock may be utilized. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A clock doubler circuit comprising:
   a filtering circuit including a first input to receive a first clock signal, a first output to provide a second clock signal, and a second output to provide a third clock signal, wherein the third clock signal is a complementary signal to the second clock signal, wherein the first clock signal, the second clock signal, and the third clock signal are at a first clock frequency, wherein the second clock signal is a low pass filtered version of the first clock signal;
   a frequency doubling circuit including:
   a first input to receive the second clock signal and a second input to receive the third clock signal;
   an output node, the output node providing a fourth clock signal at a second clock frequency that is twice the first clock frequency.

2. The clock doubler circuit of claim 1 wherein the frequency doubling circuit comprises:
   a current source;
   a first transistor coupled in series between the output node and the current source, a control terminal of the first transistor coupled to receive the second clock signal;
   a second transistor coupled to the current source, a control terminal of the second transistor coupled to receive the third clock signal; and
   a load element located between a voltage supply terminal and the output node.

3. The clock doubler circuit of claim 2 wherein the second transistor includes a second current terminal, the output node is coupled between the load element and the second current terminal of the second transistor.

4. The clock doubler circuit of claim 2 wherein the frequency doubling circuit further comprises a capacitor coupled in parallel with the current source.

5. The clock doubler circuit of claim 2 wherein the frequency doubling circuit further comprises:
   a second output node for providing a fifth clock signal at the second clock frequency;
   a second current source;
   a third transistor coupled in series between the second output node and the second current source, a control terminal of the third transistor is coupled to receive the second clock signal;
   a fourth transistor coupled in series between the output node and the second current source, a control terminal of the fourth transistor is coupled to receive the third clock signal; and
   a second load element located between the voltage supply terminal and the second output node;
   wherein the second transistor is coupled in series between the second output node and the current source.

6. The clock doubler circuit of claim 5 wherein the first current source is adjustable with respect to the second current source to adjust the duty cycle of the fourth clock signal.

7. The clock doubler circuit of claim 5 further comprising:
   a clock shaping circuit including a first input to receive the fourth clock signal and a second input to receive the fifth clock signal, the clock shaping circuit including an output to provide a sixth clock signal generated from the fourth clock signal and the fifth clock signal at the second clock frequency, wherein the sixth clock signal is characterized as having higher frequency components than the fourth clock signal and the fifth clock signal.

8. The clock doubler circuit of claim 1 further comprising:
   a clock shaping circuit including a first input to receive the fourth clock signal, the clock shaping circuit including an output to provide a fifth clock signal generated from the fourth clock signal at the second clock frequency, wherein the fifth clock signal is characterized as having higher frequency components than the fourth clock signal.

9. The clock doubler circuit of claim 8 wherein the first clock signal and the fifth clock signal are each characterized as square wave clock signals.

10. A method of doubling a frequency of a clock signal, the method comprising:
  receiving a first clock signal at a first clock frequency;
  generating a second clock signal and a third clock signal at the first clock frequency from the first clock signal, wherein the third clock signal is a complementary signal to the second clock signal, wherein the second clock signal is a low pass filtered version of the first clock signal; and
  generating from the second clock signal and the third clock signal a fourth clock signal at a second clock frequency that is double the first clock frequency.

11. The method of claim 10 further comprising:
  generating from the fourth clock signal, a fifth clock signal at the second clock frequency, wherein the fifth clock signal is characterized as having higher frequency components than the fourth clock signal.

12. The method of claim 11 wherein the generating the fifth clock signal includes amplifying the fourth clock signal.

13. The method of claim 11 wherein the first clock signal and the fifth clock signal are characterized as square wave clock signals.

14. The method of claim 10 wherein the first clock signal is characterized as a square wave clock signal.

15. The method of claim 10 wherein the generating the second clock signal includes low pass filtering the first clock signal, wherein the generating the third clock signal includes inverting the first clock signal to produce an inverted clock signal and low pass filtering the inverted clock signal.

16. The method of claim 10 wherein the generating the fourth clock signal includes controlling a first transistor with the second clock signal and controlling a second transistor with the third clock signal, wherein each of the first transistor and the second transistor includes a first current terminal connected to a node coupled to a current source, wherein the fourth clock signal is generated from an output node coupled between a second current terminal of the first transistor and a load element.

17. The method of claim 16 wherein the output node is coupled between a second current terminal of the second transistor and the load element.

18. A clock doubler circuit of comprising:
  a current source;
  a first input to receive a first clock signal at a first clock frequency;
  a second input to receive a second clock signal, the second clock signal being a complementary clock signal to the first clock signal, wherein a square wave clock signal at the first clock frequency would be characterized as having higher frequency components than the first clock signal and the second clock signal;
  an output node to provide a third clock signal at a second clock frequency that is double the first clock frequency;
  a first transistor coupled in series between the output node and the current source, a control terminal of the first transistor coupled to receive the first clock signal;
  a second transistor coupled to the current source, a control terminal of the second transistor coupled to receive the second clock signal;
  a load element located between a voltage supply terminal and the output node;
  a filtering circuit including a first input to receive a fourth clock signal, a first output to provide the first clock signal, and a second output to provide the second clock signal, wherein the fourth clock signal and first clock signal are at the first clock frequency, wherein the first clock signal is a low pass filtered version of the fourth clock signal; and
  a clock shaping circuit including a first input to receive the third clock signal, the clock shaping circuit including an output to provide a fifth clock signal generated from the third clock signal at the second clock frequency, wherein the fifth clock signal is characterized as having higher frequency components than the third clock signal.

19. The clock doubler circuit of claim 18 wherein the current source is coupled between a second voltage supply terminal and the first transistor, wherein the third clock signal has a peak to peak voltage that is less than a differential voltage between the voltage supply terminal and the second voltage supply terminal.

\* \* \* \* \*